(12) United States Patent
Huang et al.

(10) Patent No.: US 7,944,289 B2
(45) Date of Patent: May 17, 2011

(54) MINIMUM PULSE GENERATION IN A CLASS-D AMPLIFIER

(75) Inventors: Pei-Cheng Huang, Zhubei (TW); Jwin-Yen Guo, Jhubei (TW)

(73) Assignee: Richtek Technology Corp., Hsinchu (TW)

( * ) Notice: Subject to any disclaimer, the term of this patent is extended or adjusted under 35 U.S.C. 154(b) by 101 days.

(21) Appl. No.: 12/585,917

(22) Filed: Sep. 29, 2009

(65) Prior Publication Data

US 2010/0079208 A1   Apr. 1, 2010

(30) Foreign Application Priority Data

Oct. 1, 2008  (TW) ............................ 97137777 A

(51) Int. Cl.
*H03F 3/38* (2006.01)

(52) U.S. Cl. ...................................... 330/10; 330/207 A

(58) Field of Classification Search .................... 330/10, 330/207 A, 251; 327/131, 136; 375/238
See application file for complete search history.

(56) References Cited

U.S. PATENT DOCUMENTS 7,482,870 B2 *   1/2009   Maejima et al. ........... 330/207 P

* cited by examiner

*Primary Examiner* — Robert Pascal
*Assistant Examiner* — Khiem D Nguyen
(74) *Attorney, Agent, or Firm* — Rosenberg, Klein & Lee

(57) ABSTRACT

For minimum pulse generation in a class-D amplifier, a trapezoid switching waveform shape is used to replace the tradition triangle type to generate PWM pulses. Two voltages are compared with a sawtooth wave signal to generate the trapezoid waveform signal and a constant pulse width signal. An audio input signal is compared with the trapezoid waveform signal to generate a pulse width modulation signal, and either the pulse width modulation signal or the constant pulse width signal is used for driving a load at an output of the class-D amplifier. Flexible minimum pulse width could be obtained by offsetting one of the two voltages in generation of the constant pulse width signal.

36 Claims, 6 Drawing Sheets

US 7,944,289 B2

MINIMUM PULSE GENERATION IN A CLASS-D AMPLIFIER

FIELD OF THE INVENTION

The present invention is related generally to a class-D amplifier and, more particularly, to the minimum pulse generation in a class-D amplifier.

BACKGROUND OF THE INVENTION

As shown in FIG. 1, a typical class-D amplifier 10 includes a control circuit 12 and an output stage 14 operated by the control circuit 12. According to an audio input signal AudioIN, the control circuit 12 provides pulse width modulation (PWM) output signals VOUTP and VOUTN to switch PMOS transistors P1, P2 and NMOS transistors N1, N2 in the output stage 14 for driving a load. In order to prevent the output signals VOUTP and VOUTN from having excessively short PWM pulses to cause the output stage 14 to short through, a minimum pulse mechanism is provided to enforce the PWM pulses of the output signals VOUTP and VOUTN to have pulse widths not shorter than a minimum pulse width.

There are two conventional methods for minimum pulse generation in a class-D amplifier; one is to generate a one shot pulse by use of a timing delay difference between two input channels, for example, disclosed by U.S. Pat. No. 6,262,632 to Corsi et al., and the other is to generate a minimum pulse by use of rising edge and falling edge detection of a variable switching pulse, for example, proposed by U.S. Pat. No. 6,847,257 to Edwards et al. However, even with either one of these two methods, when the audio input signal AudioIN has an amplitude over than the internal switching amplitude, the PWM output would be missed and then cause the output stage 14 to continue short through. Moreover, the minimum pulse also introduces a nonlinear phenomenon.

SUMMARY OF THE INVENTION

An object of the present invention is to provide circuits and methods for minimum pulse generation in a class-D amplifier.

In a first class-D amplifier according to the present invention, two voltages are compared with a sawtooth wave signal to generate a trapezoid waveform signal and a constant pulse width signal. An audio input signal is compared with the trapezoid waveform signal to generate a pulse width modulation signal, and either the pulse width modulation signal or the constant pulse width signal is used for driving a load at an output of the class-D amplifier. When the pulse width of the pulse width modulation signal is greater than that of the constant pulse width signal, the driving signal will be equal to the pulse width modulation signal. When the pulse width of the pulse width modulation signal is smaller than that of the constant pulse width signal, the driving signal will be equal to the constant pulse width signal. Due to the constant pulse width signal generated by comparing one of the two voltages with the sawtooth wave signal, the driving signal will have a fix minimum pulse width even when the audio input signal is greater in amplitude than the trapezoid waveform signal.

In a second class-D amplifier according to the present invention, two voltages are compared with a first sawtooth wave signal to generate a first trapezoid waveform signal and a first constant pulse width signal. A first audio input signal is compared with the first trapezoid waveform signal to generate a first pulse width modulation signal, and either the first pulse width modulation signal or the first constant pulse width signal is used as a first driving signal. When the pulse width of the first pulse width modulation signal is greater than that of the first constant pulse width signal, the first driving signal will be equal to the first pulse width modulation signal. When the pulse width of the first pulse width modulation signal is smaller than that of the first constant pulse width signal, the first driving signal will be equal to the first constant pulse width signal. Due to the first constant pulse width signal generated by comparing one of the two voltages with the first sawtooth wave signal, the first driving signal will have a first fix minimum pulse width even when the first audio input signal is greater in amplitude than the first trapezoid waveform signal. Another two voltages are compared with a second sawtooth wave signal to generate a second trapezoid waveform signal and a second constant pulse width signal. A second audio input signal is compared with the second trapezoid waveform signal to generate a second pulse width modulation signal, and either the second pulse width modulation signal or the second constant pulse width signal is used as a second driving signal. When the pulse width of the second pulse width modulation signal is greater than that of the second constant pulse width signal, the second driving signal will be equal to the second pulse width modulation signal. When the pulse width of the second pulse width modulation signal is smaller than that of the second constant pulse width signal, the second driving signal will be equal to the second constant pulse width signal. Due to the second constant pulse width signal generated by comparing one of the another two voltages with the second sawtooth wave signal, the second driving signal will have a second fix minimum pulse width even when the second audio input signal is greater in amplitude than the second trapezoid waveform signal. The first and second driving signals are used for driving a load at an output of the class-D amplifier. A mechanism is further provided to compensate the estimated error between the first constant pulse width signal and the first pulse width modulation signal. When the first audio input signal is greater in amplitude than the first trapezoid waveform signal, the error between the first constant pulse width signal and the first pulse width modulation signal is counted, and then a compensated pulse width is added into the second driving signal. According this mechanism, the total pulse width across the load is approximated the real input audio signal implied PWM duty.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
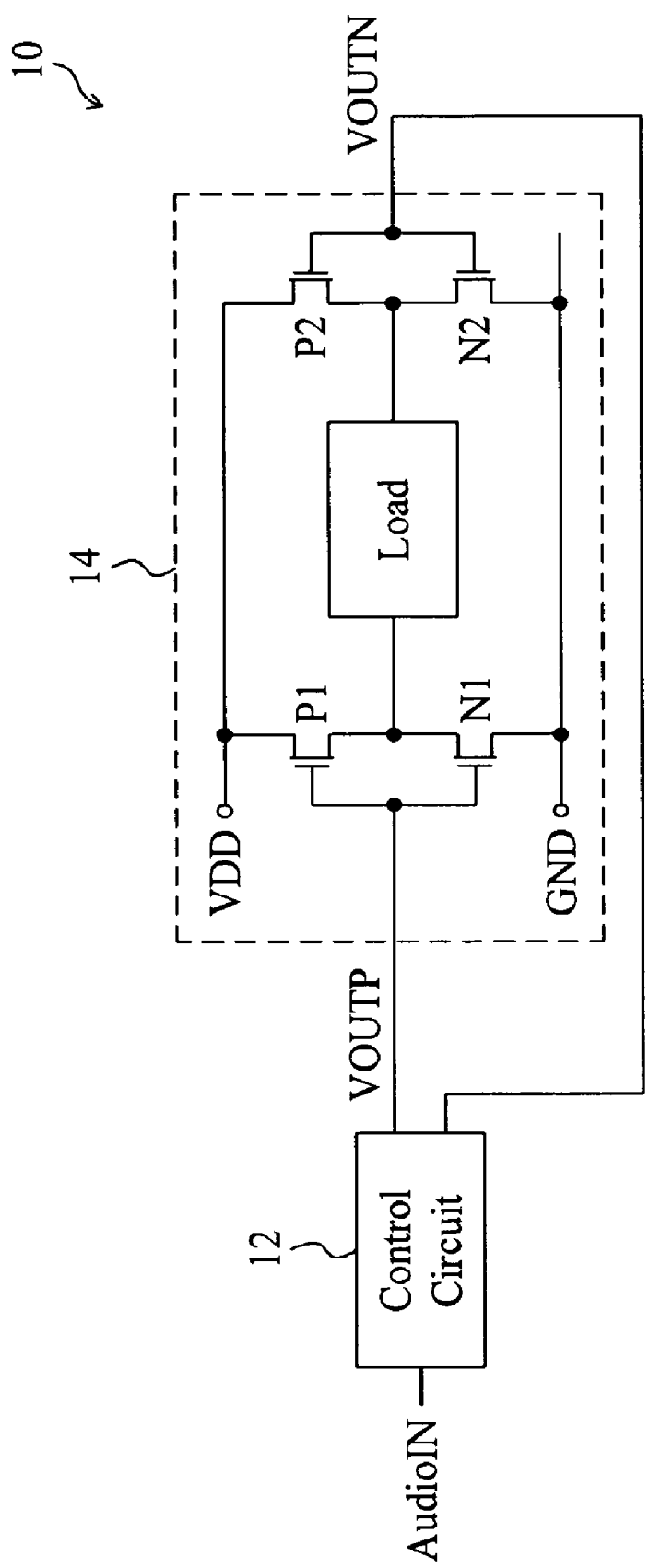
FIG. 1 is a systematic diagram of a typical class-D amplifier.
Figure 2:
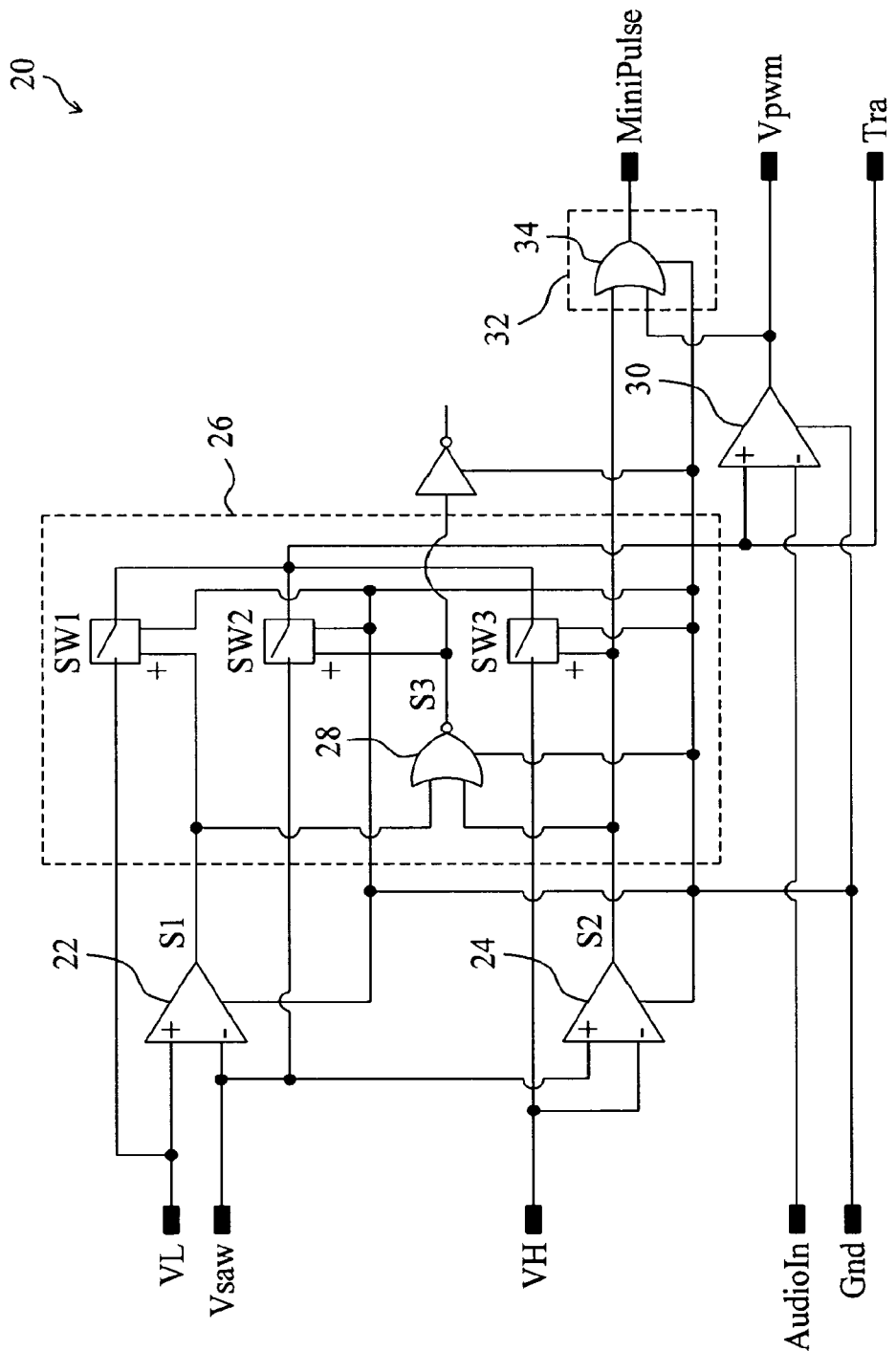
FIG. 2 is a circuit diagram of a first embodiment according to the present invention.
Figure 3:
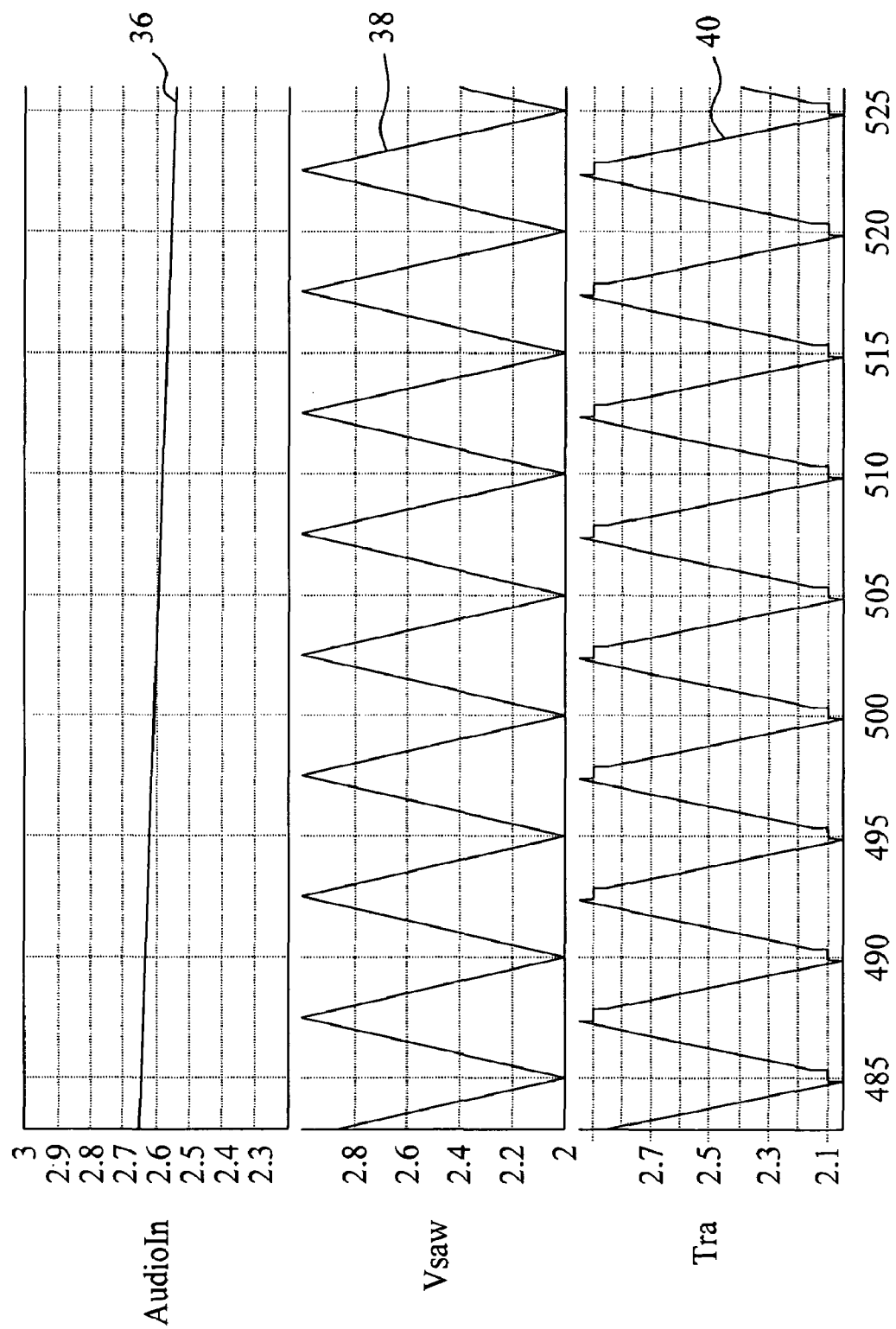
FIG. 3 is a waveform diagram of the circuit shown in FIG. 2.

FIG. 2 is a circuit diagram of a first embodiment according to the present invention, and FIG. 3 is a waveform diagram of the circuit shown in FIG. 2. Referring to FIG. 2, in a class-D amplifier 20, a comparator 22 compares a voltage VL with a sawtooth wave signal Vsaw having the waveform 38 shown in FIG. 3, to thereby generate a signal S1, a comparator 24 compares a voltage VH with the sawtooth wave signal Vsaw to thereby generate a signal S2, a switching circuit 26 includes a switch SW1 coupled between the voltage node VL and a non-inverting input of a comparator 30, a switch SW2 coupled between the sawtooth wave signal input Vsaw and the non-inverting input of the comparator 30, and a switch SW3 coupled between the voltage node VH and the non-inverting input of the comparator 30, the output S1 of the comparator 22 controls the switch SW1 in such a way that the switch SW1 is turned on when the sawtooth wave signal Vsaw is lower than the voltage VL, the output S2 of the comparator 24 controls the switch SW3 in such a way that the switch SW3 is turned on when the sawtooth wave signal Vsaw is higher than the voltage VH, a NOR gate 28 generates a signal S3 according to the signals S1 and S2 to control the switch SW2 in such a way that the switch SW2 is turned on when both the signals S1 and S2 are low, the switching circuit 26 switches the voltage VL, the sawtooth wave signal Vsaw, or the voltage VH to the non-inverting input of the comparator 30 according to the signals S1 and S2, such that the signal Tra at the non-inverting input of the comparator 30 has a trapezoid waveform 40 shown in FIG. 3, the comparator 30 compares an audio input signal AudioIn, as shown by the waveform 36 of FIG. 3, with the signal Tra to thereby generate a pulse width modulation signal Vpwm, and a driver 32 includes an OR gate 34 to generate a signal MiniPulse according to the signals S2 and Vpwm for driving a loudspeaker at an output of the class-D amplifier 20.

According to the present invention, a trapezoid switching waveform shape is used to replace the tradition triangle type to generate PWM pulses for class-D amplifier applications. In further detail, as shown in the above embodiment, the audio input signal AudioIn is compared with the trapezoid waveform signal Tra to generate the pulse width modulation signal Vpwm. In addition, by comparing the voltage VH with the sawtooth wave signal Vsaw to generate the constant pulse width signal S2 which is independent of the audio input signal AudioIn, the signal MiniPulse shall have a minimum pulse width even if the audio input signal AudioIn is greater in amplitude than the signal Tra. When the pulse width of the pulse width modulation signal Vpwm is greater than the pulse width of the signal S2, the signal MiniPulse will be equal to the pulse width modulation signal Vpwm. When the pulse width of the pulse width modulation signal Vpwm is smaller than the pulse width of the signal S2, the signal MiniPulse will be equal to the signal S2. Moreover, the pulse width of the signal S2 is adjustable by offsetting the voltage VH to achieve the best PWM energy equivalent output to input amplitude. While the signal MiniPulse in this embodiment is generated by using the signal S2 and the pulse width modulation signal Vpwm, it may be generated by using the signal S1 and the pulse width modulation signal Vpwm in other embodiments.

Figure 4:
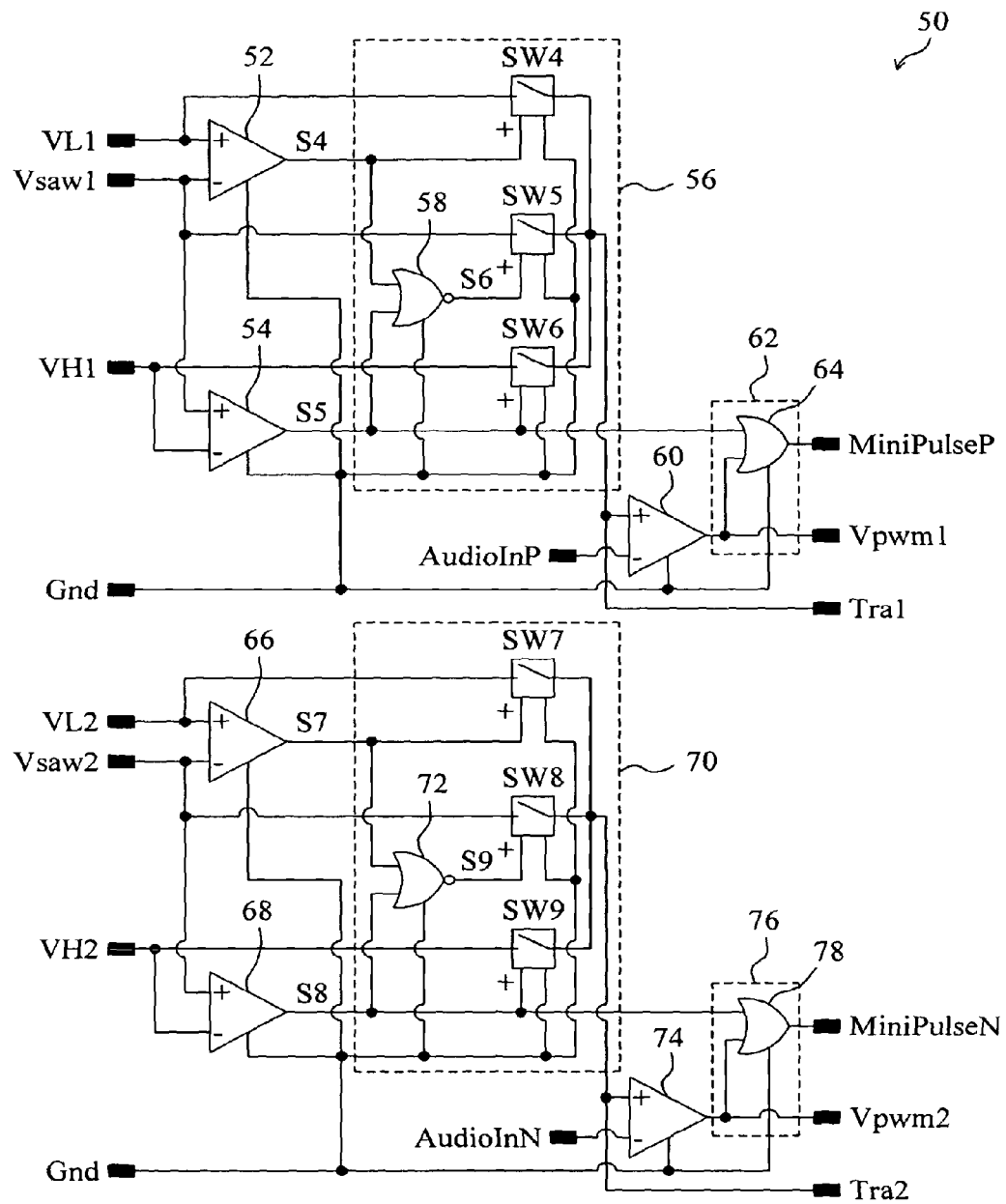
FIG. 4 is a circuit diagram of a second embodiment according to the present invention.

FIG. 4 is a circuit diagram of a second embodiment according to the present invention. In a class-D amplifier 50, a comparator 52 generates a signal S4 by comparing a voltage VL1 with a sawtooth wave signal Vsaw1, a comparator 54 generates a signal S5 by comparing a voltage VH1 with the sawtooth wave signal Vsaw1, a switching circuit 56 switches the voltage VL1, the sawtooth wave signal Vsaw1, or the voltage VH1 to a non-inverting input of a comparator 60 according to the signals S4 and S5 to thereby generate a trapezoid waveform signal Tra1 at the non-inverting input of the comparator 60, the switching circuit 56 includes a NOR gate 58 to generate a signal S6 from the signals S4 and S5, a switch SW4 coupled between the voltage node VL1 and the non-inverting input of the comparator 60 and controlled by the signal S4, a switch SW5 coupled between the sawtooth wave signal input Vsaw1 and the non-inverting input of the comparator 60 and controlled by the signal S6, and a switch SW6 coupled between the voltage node VH1 and the non-inverting input of the comparator 60 and controlled by the signal S5, the comparator 60 compares the signal Tra1 with an audio input signal AudioInP to thereby generate a pulse width modulation signal Vpwm1, and a driver 62 includes an OR gate 64 to generate a signal MiniPulseP from the pulse width modulation signal Vpwm1 and the signal S5. On the other hand, a comparator 66 generates a signal S7 by comparing a voltage VL2 with a sawtooth wave signal Vsaw2, a comparator 68 generates a signal S8 by comparing a voltage VH2 with the sawtooth wave signal Vsaw2, a switching circuit 70 switches the voltage VL2, the sawtooth wave signal Vsaw2, or the voltage VH2 to a non-inverting input of a comparator 74 according to the signals S7 and S8 to thereby generate a trapezoid waveform signal Tra2 at the non-inverting input of the comparator 74, the switching circuit 70 includes a NOR gate 72 to generate a signal S9 from the signals S7 and S8, a switch SW7 coupled between the voltage node VL2 and the non-inverting input of the comparator 74 and controlled by the signal S7, a switch SW8 coupled between the sawtooth wave signal input Vsaw2 and the non-inverting input of the comparator 74 and controlled by the signal S9, and a switch SW9 coupled between the voltage node VH2 and the non-inverting input of the comparator 74 and controlled by the signal S8, the comparator 74 compares the signal Tra2 with an audio input signal AudioInN to thereby generate a pulse width modulation signal Vpwm2, and a driver 76 includes an OR gate 78 to generate a signal MiniPulseN from the pulse width modulation signal Vpwm2 and the signal S8. The signals MiniPulseP and MiniPulseN are used to drive a loudspeaker at an output of the class-D amplifier 50.

Figure 5:
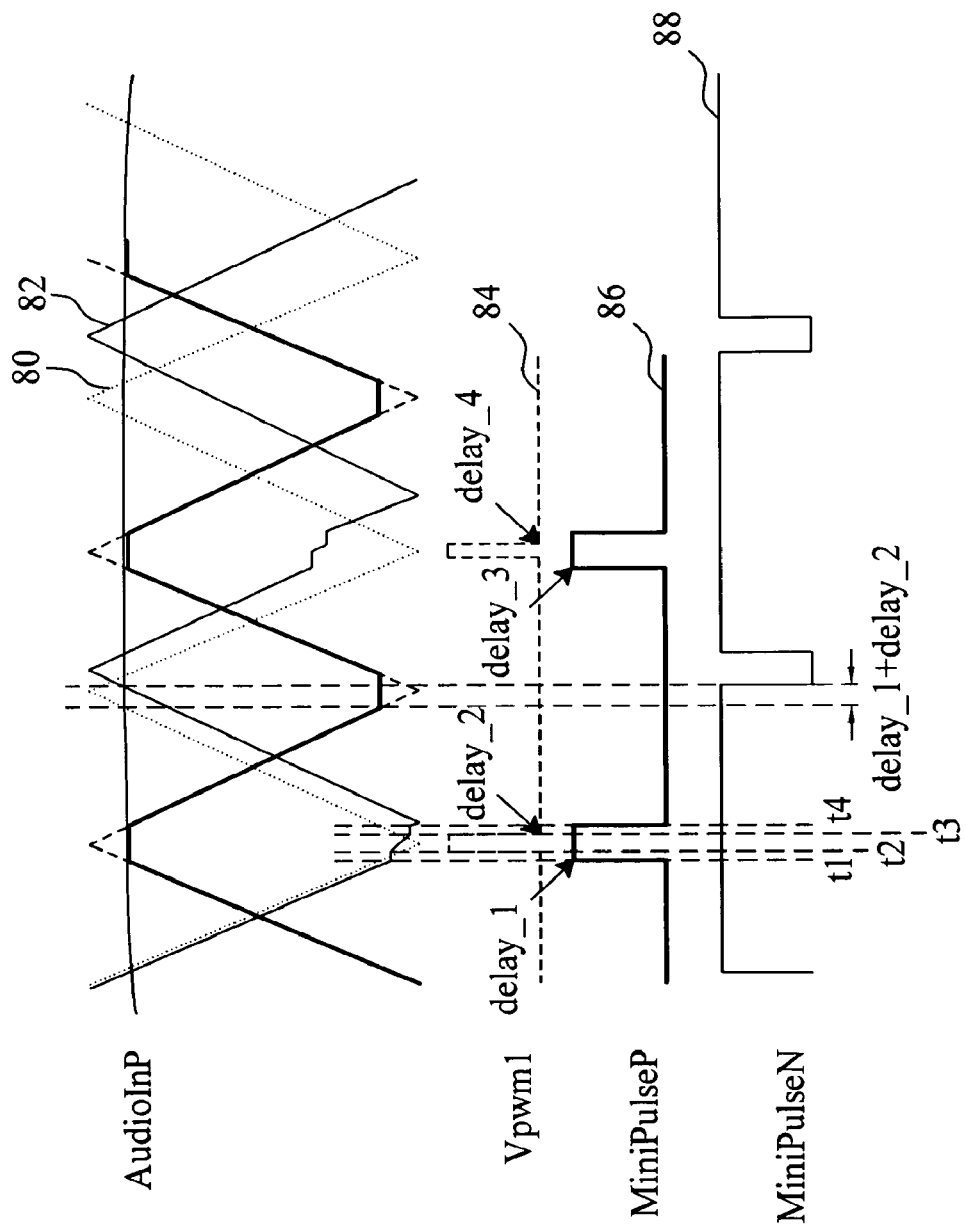
FIG. 5 is a waveform diagram of the circuit shown in FIG. 4.
Figure 6:
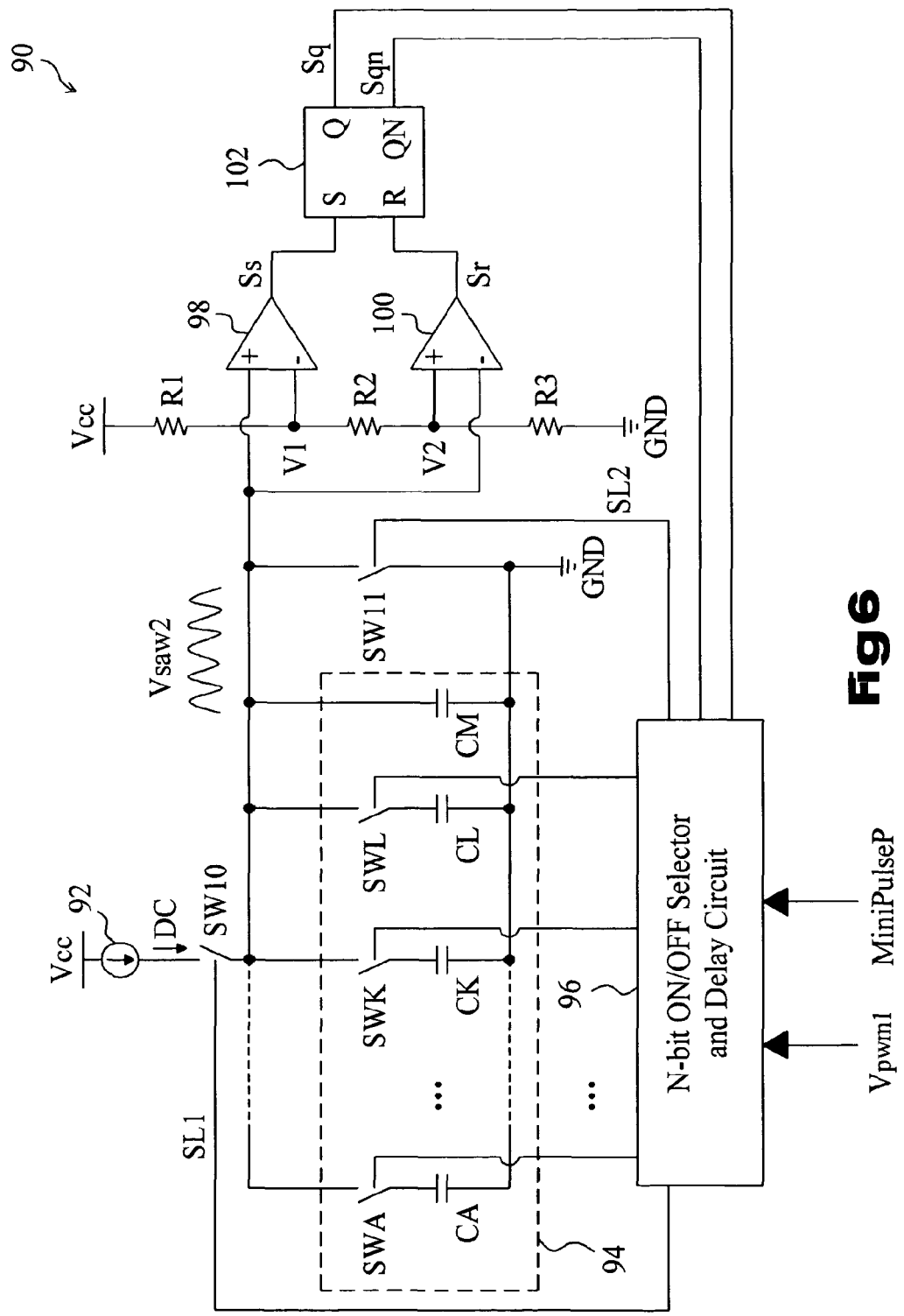
FIG. 6 is a circuit diagram of a sawtooth wave generator for generating a sawtooth wave signal.

FIG. 5 is a waveform diagram of the circuit shown in FIG. 4, in which waveform 80 represents the original sawtooth wave signal Vsaw2, waveform 82 represents a delay of the sawtooth wave signal Vsaw2, waveform 84 represents the pulse width modulation signal Vpwm1, waveform 86 represents the signal MiniPulseP, and waveform 88 represents the signal MiniPulseN. FIG. 6 is a circuit diagram of a sawtooth wave generator 90 for providing the sawtooth wave signal Vsaw2, in which capacitors CA, . . . , CK, CL, and CM together with switches SWA, . . . , SWK, and SWL establish a variable capacitor 94, a current source 92 provides a constant current DC for charging the variable capacitor 94, a switch SW10 is coupled between the current source 92 and the variable capacitor 94, a switch SW11 is connected in parallel with the variable capacitor 94, an N-bit on/off selector and delay circuit 96 controls the switches SW10 and SW11 to control the charging and discharging of the variable capacitor 94 for generating the sawtooth wave signal Vsaw2, the N-bit on/off selector and delay circuit 96 also controls the switches SWA, . . . , SWK, and SWL to determine the capacitance of the variable capacitor 94, voltage divider resistors R1, R2 and R3 divide a voltage Vcc to thereby generate voltages V1 and V2, a comparator 98 compares the sawtooth wave signal Vsaw2 with the voltage V1 to thereby generate a comparison signal Ss, a comparator 100 compares the sawtooth wave signal Vsaw2 with the voltage V2 to thereby generate a comparison signal Sr, and a flip-flop 102 generates signals Sq and Sqn according to the signals Ss and Sr for the N-bit on/off selector and delay circuit 96. In the sawtooth wave generator 90, the N-bit on/off selector and delay circuit

96 generates random control signals for switching the switches SWA, . . . , SWK, and SWL for changing the capacitance of the variable capacitor 94, and the current source 92 provides the constant current DC to charge the variable capacitor 94. Therefore, each time the sawtooth wave signal Vsaw2 will require a different time period to reach the voltage V1, and in consequence a randomly oscillated sawtooth wave signal Vsaw2 is obtained.

Referring to FIGS. 5 and 6, when the audio input signal AudioInP is greater in amplitude than the signal Tra1, the N-bit on/off selector and delay circuit 96 detects an error value between the pulse width modulation signal Vpwm1 and the signal MiniPulseP and adjusts the pulse width of the signal MiniPulseN according to the error value, such that the total pulse width applied to the loudspeaker approximates the PWM duty of the real audio input signal AudioInP, and thus the nonlinear phenomenon caused by the minimum pulse is improved. In further detail, at time t1, the pulse width modulation signal Vpwm1 is out of phase with the signal MinipulseP as shown by the waveforms 84 and 86, so that the N-bit on/off selector and delay circuit 96 turns off the switch SW11 to maintain the present level of the sawtooth wave signal Vsaw2. At time t2, the N-bit on/off selector and delay circuit 96 turns on the switch SW11 to delay the sawtooth wave signal Vsaw2 by a time delay_1. Similarly, from time t3 to time t4, the pulse width modulation signal Vpwm1 is out of phase with the signal MiniPulseP, and the N-bit on/off selector and delay circuit 96 turns off the switch SW11 to delay the sawtooth wave signal Vsaw2 by a time delay_2. In other words, an error value delay_1+delay_2 exists between the pulse width modulation signal Vpwm1 and the signal MiniPulseP, and therefore the N-bit on/off selector and delay circuit 96 delays the sawtooth wave signal Vsaw2 by a time delay_1+delay_2 as shown by the waveforms 80 and 82. Hence, the signal Tra2 is delayed by the time delay_1+delay_2, and the pulse width of the signal MiniPulseN is increased by delay_1+delay_2 as shown by the waveform 88.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A class-D amplifier, comprising:
    a first input to receive a first voltage;
    a second input to receive a sawtooth wave signal;
    a third input to receive a second voltage;
    a fourth input to receive an audio input signal;
    a first comparator coupled to the first and second inputs to compare the first voltage with the sawtooth wave signal to thereby generate a first signal;
    a second comparator coupled to the second and third inputs to compare the second voltage with the sawtooth wave signal to thereby generate a second signal;
    a switching circuit coupled to the first, second and third inputs and the first and second comparators, to switch the first voltage, the sawtooth wave signal, or the second voltage to an output of the switching circuit according to the first and second signals to thereby provide a third signal at the output of the switching circuit;
    a third comparator coupled to the fourth input and the output of the switching circuit to compare the audio input signal with the third signal to generate a pulse width modulation signal; and
    a driver coupled to the second and third comparators to generate a fourth signal according to the second signal and the pulse width modulation signal for driving a load at an output of the class-D amplifier.

2. The class-D amplifier of claim 1, wherein the switching circuit operates so that the third signal has a trapezoid waveform.

3. The class-D amplifier of claim 1, wherein the switching circuit comprises:
    a first switch coupled between the first input and the output of the switching circuit to be switched by the first signal to switch the first voltage to the output of the switching circuit;
    a second switch coupled between the second input and the output of the switching circuit to be switched according to the first and second signals to switch the sawtooth wave signal to the output of the switching circuit; and
    a third switch coupled between the third input and the output of the switching circuit to be switched by the second signal to switch the second voltage to the output of the switching circuit.

4. The class-D amplifier of claim 1, wherein the driver comprises an OR gate to generate the fourth signal according to the second signal and the pulse width modulation signal.

5. The class-D amplifier of claim 1, wherein the first signal has a pulse width adjusted by an offset of the first voltage.

6. The class-D amplifier of claim 1, wherein the second signal has a pulse width adjusted by an offset of the second voltage.

7. A control method for a class-D amplifier, comprising:
    comparing a first voltage with a sawtooth wave signal to thereby generate a first signal;
    comparing a second voltage with the sawtooth wave signal to thereby generate a second signal;
    switching the first voltage, the sawtooth wave signal, or the second voltage to a terminal according to the first and second signals to thereby generate a third signal at the terminal;
    comparing an audio input signal with the third signal to generate a pulse width modulation signal; and
    generating a fourth signal according to the second signal and the pulse width modulation signal for driving a load at an output of the class-D amplifier.

8. The control method of claim 7, wherein the third signal has a trapezoid waveform.

9. The control method of claim 7, further comprising offsetting the first voltage to adjust a pulse width of the first signal.

10. The control method of claim 7, further comprising offsetting the second voltage to adjust a pulse width of the second signal.

11. A class-D amplifier, comprising:
    a first input to receive a first voltage;
    a second input to receive a first sawtooth wave signal;
    a third input to receive a second voltage;
    a fourth input to receive a first audio input signal;
    a first comparator coupled to the first and second inputs to compare the first voltage with the first sawtooth wave signal to thereby generate a first signal;
    a second comparator coupled to the second and third inputs to compare the second voltage with the first sawtooth wave signal to thereby generate a second signal;
    a first switching circuit coupled to the first, second and third inputs and the first and second comparators, to switch the first voltage, the first sawtooth wave signal, or the second voltage to an output of the first switching circuit according to the first and second signals to thereby provide a third signal at the output of the first switching circuit;
a third comparator coupled to the fourth input and the output of the first switching circuit to compare the first audio input signal with the third signal to generate a first pulse width modulation signal;
a first driver coupled to the second and third comparators to generate a fourth signal according to the second signal and the first pulse width modulation signal;
a fifth input to receive a third voltage;
a sixth input to receive a second sawtooth wave signal;
a seventh input to receive a fourth voltage;
an eighth input to receive a second audio input signal;
a fourth comparator coupled to the fifth and sixth inputs to compare the third voltage with the second sawtooth wave signal to thereby generate a fifth signal;
a fifth comparator coupled to the sixth and seventh inputs to compare the fourth voltage with the second sawtooth wave signal to thereby generate a sixth signal;
a second switching circuit coupled to the fifth, sixth and seventh inputs and the fourth and fifth comparators, to switch the third voltage, the second sawtooth wave signal, or the fourth voltage to an output of the second switching circuit according to the fifth and sixth signals to thereby provide a seventh signal at the output of the second switching circuit;
a sixth comparator coupled to the eighth input and the output of the second switching circuit to compare the second audio input signal with the seventh signal to generate a second pulse width modulation signal; and
a second driver coupled to the fifth and sixth comparators to generate a eighth signal according to the sixth signal and the second pulse width modulation signal;
wherein the fourth and eighth signals are used for driving a load at an output of the class-D amplifier.

12. The class-D amplifier of claim 11, wherein the first switching circuit operates so that the third signal has a trapezoid waveform.

13. The class-D amplifier of claim 11, wherein the second switching circuit operates so that the seventh signal has a trapezoid waveform.

14. The class-D amplifier of claim 11, wherein the first switching circuit comprises:
a first switch coupled between the first input and the output of the first switching circuit to be switched by the first signal to switch the first voltage to the output of the first switching circuit;
a second switch coupled between the second input and the output of the first switching circuit to be switched according to the first and second signals to switch the first sawtooth wave signal to the output of the first switching circuit; and
a third switch coupled between the third input and the output of the first switching circuit to be switched by the second signal to switch the second voltage to the output of the first switching circuit.

15. The class-D amplifier of claim 11, wherein the second switching circuit comprises:
a first switch coupled between the fifth input and the output of the second switching circuit to be switched by the fifth signal to switch the third voltage to the output of the second switching circuit;
a second switch coupled between the sixth input and the output of the second switching circuit to be switched according to the fifth and sixth signals to switch the second sawtooth wave signal to the output of the second switching circuit; and
a third switch coupled between the seventh input and the output of the second switching circuit to be switched by the sixth signal to switch the fourth voltage to the output of the second switching circuit.

16. The class-D amplifier of claim 11, wherein the first driver comprises an OR gate to generate the fourth signal according to the second signal and the first pulse width modulation signal.

17. The class-D amplifier of claim 11, wherein the second driver comprises an OR gate to generate the eighth signal according to the sixth signal and the second pulse width modulation signal.

18. The class-D amplifier of claim 11, wherein the first signal has a pulse width adjusted by an offset of the first voltage.

19. The class-D amplifier of claim 11, wherein the second signal has a pulse width adjusted by an offset of the second voltage.

20. The class-D amplifier of claim 11, wherein the fifth signal has a pulse width adjusted by an offset of the third voltage.

21. The class-D amplifier of claim 11, wherein the sixth signal has a pulse width adjusted by an offset of the fourth voltage.

22. The class-D amplifier of claim 11, further comprising:
a current source;
a capacitor;
a first switch coupled between the current source and the capacitor;
a second switch parallel connected to the capacitor; and
a delay circuit coupled to the first and second switches to switch the first and second switches to charge and discharge the capacitor to thereby providing the second sawtooth wave signal by the capacitor.

23. The class-D amplifier of claim 22, wherein the delay circuit detects an error value between the fourth signal and the first pulse width modulation signal when the first audio input signal is greater in amplitude than the third signal, to determine a delay time for delaying the second sawtooth wave signal.

24. The class-D amplifier of claim 22, further comprising an on/off selector coupled to the capacitor to control the capacitance of the capacitor.

25. The class-D amplifier of claim 24, further comprising:
a seventh comparator coupled to the capacitor to compare the second sawtooth wave signal with a first reference voltage to thereby generate a ninth signal;
an eighth comparator coupled to the capacitor to compare the second sawtooth wave signal with a second reference voltage to thereby generate a tenth signal; and
a flip-flop coupled to the seventh and eighth comparators and the on/off selector to generate an eleventh signal according to the ninth and tenth signals, for the on/off selector to determine the capacitance of the capacitor.

26. A control method for a class-D amplifier, comprising:
comparing a first voltage with a first sawtooth wave signal to thereby generate a first signal;
comparing a second voltage with the first sawtooth wave signal to thereby generate a second signal;
switching the first voltage, the first sawtooth wave signal, or the second voltage to a first terminal according to the first and second signals to thereby generate a third signal at the first terminal;

comparing a first audio input signal with the third signal to generate a first pulse width modulation signal;
generating a fourth signal according to the second signal and the first pulse width modulation signal;
comparing a third voltage with a second sawtooth wave signal to thereby generate a fifth signal;
comparing a fourth voltage with the second sawtooth wave signal to thereby generate a sixth signal;
switching the third voltage, the second sawtooth wave signal, or the fourth voltage to a second terminal according to the fifth and sixth signals to thereby generate a seventh signal at the second terminal;
comparing a second audio input signal with the seventh signal with to thereby generate a second pulse width modulation signal;
generating an eighth signal according to the sixth signal and the second pulse width modulation signal; and
providing the fourth and eighth signals for driving a load at an output of the class-D amplifier.

27. The control method of claim 26, wherein the third signal has a trapezoid waveform.

28. The control method of claim 26, wherein the seventh signal has a trapezoid waveform.

29. The control method of claim 26, further comprising offsetting the first voltage to adjust a pulse width of the first signal.

30. The control method of claim 26, further comprising offsetting the second voltage to adjust a pulse width of the second signal.

31. The control method of claim 26, further comprising offsetting the third voltage to adjust a pulse width of the fifth signal.

32. The control method of claim 26, further comprising offsetting the fourth voltage to adjust a pulse width of the sixth signal.

33. The control method of claim 26, further comprising:
detecting an error value between the fourth signal and the first pulse width modulation signal when the first audio input signal is greater in amplitude than the third signal; and
delaying the second sawtooth wave signal by a delay time according to the error value.

34. The control method of claim 26, further comprising:
charging and discharging a capacitor to generate the second sawtooth wave signal; and
stopping charging and discharging the capacitor according to the fourth signal and the first pulse width modulation signal to thereby delay the second sawtooth wave signal.

35. The control method of claim 34, wherein the step of stopping charging and discharging the capacitor according to the fourth signal and the first pulse width modulation signal to thereby delay the second sawtooth wave signal comprises stopping charging and discharging the capacitor when the fourth signal is out of phase with the first pulse width modulation signal.

36. The control method of claim 34, further comprising:
comparing the second sawtooth wave signal with a first reference voltage to thereby generate a ninth signal;
comparing the second sawtooth wave signal with a second reference voltage to thereby generate a tenth signal; and
controlling the capacitance of the capacitor according to the ninth and tenth signals.

* * * * *